United States Patent [19]

Brueck et al.

[11] Patent Number: 4,881,236
[45] Date of Patent: Nov. 14, 1989

[54] WAVELENGTH-RESONANT SURFACE-EMITTING SEMICONDUCTOR LASER

[75] Inventors: Steven R. J. Brueck; Christian F. Schaus; Marek A. Osinski, all of Albuquerque; John G. McInerney, Cedar Crest; M. Yasin A. Raja; Thomas M. Brennan, both of Albuquerque; Burrell E. Hammons, Tijeras, all of N. Mex.

[73] Assignee: University of New Mexico, Albuquerque, N. Mex.

[21] Appl. No.: 184,745

[22] Filed: Apr. 22, 1988

[51] Int. Cl.$^4$ .............................................. H01S 3/19
[52] U.S. Cl. ....................................... 372/45; 330/4.3; 372/46; 372/50
[58] Field of Search ................... 372/43, 44, 45, 46, 372/50, 96; 357/16, 17; 330/4.3

[56] References Cited

U.S. PATENT DOCUMENTS 4,675,876 6/1987 Svilans .................................. 372/96

OTHER PUBLICATIONS

Appl. Phys. Lett. 51(21), Nov. 23, 1987, "Surface-Emitting Laser Diode (etc.)", by Ogura et al, pp. 1655–1657.
Appl. Phys. Lett 50(18), May 4, 1987, "Visible Room-Temperature, Surface-Emitting Laser, (etc.)", by Gourley et al pp. 1225–1227.

*Primary Examiner*—James W. Davie
*Attorney, Agent, or Firm*—Albert Sopp

[57] ABSTRACT

A wavelength resonant semiconductor gain medium is disclosed. The essential feature of this medium is a multiplicity of quantum-well gain regions separated by semiconductor spacer regions of higher bandgap. Each period of this medium consisting of one quantum-well region and the adjacent spacer region is chosen such that the total width is equal to an integral multiple of ½ the wavelength in the medium of the radiation with which the medium is interacting. Optical, electron-beam and electrical injection pumping of the medium is disclosed. This medium may be used as a laser medium for single devices or arrays either with or without reflectors, which may be either semiconductor or external.

8 Claims, 5 Drawing Sheets

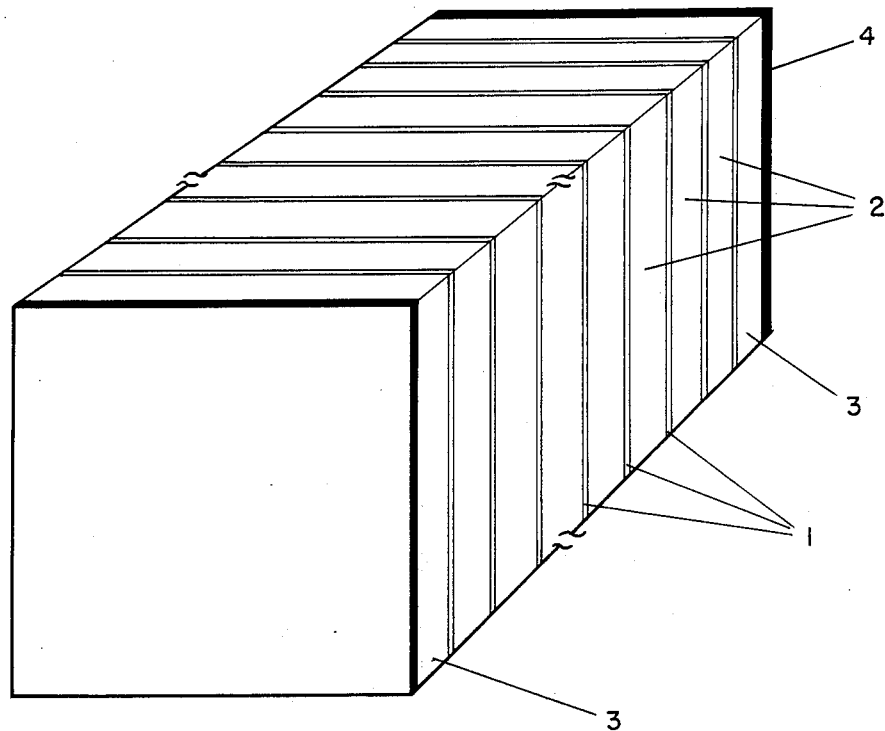
FIG—3
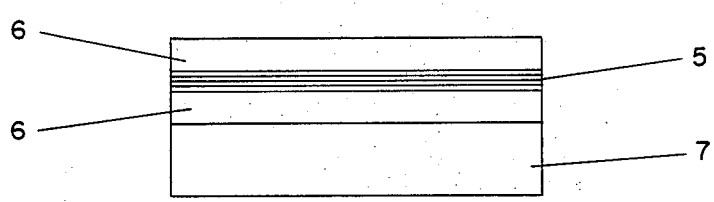
FIG—4

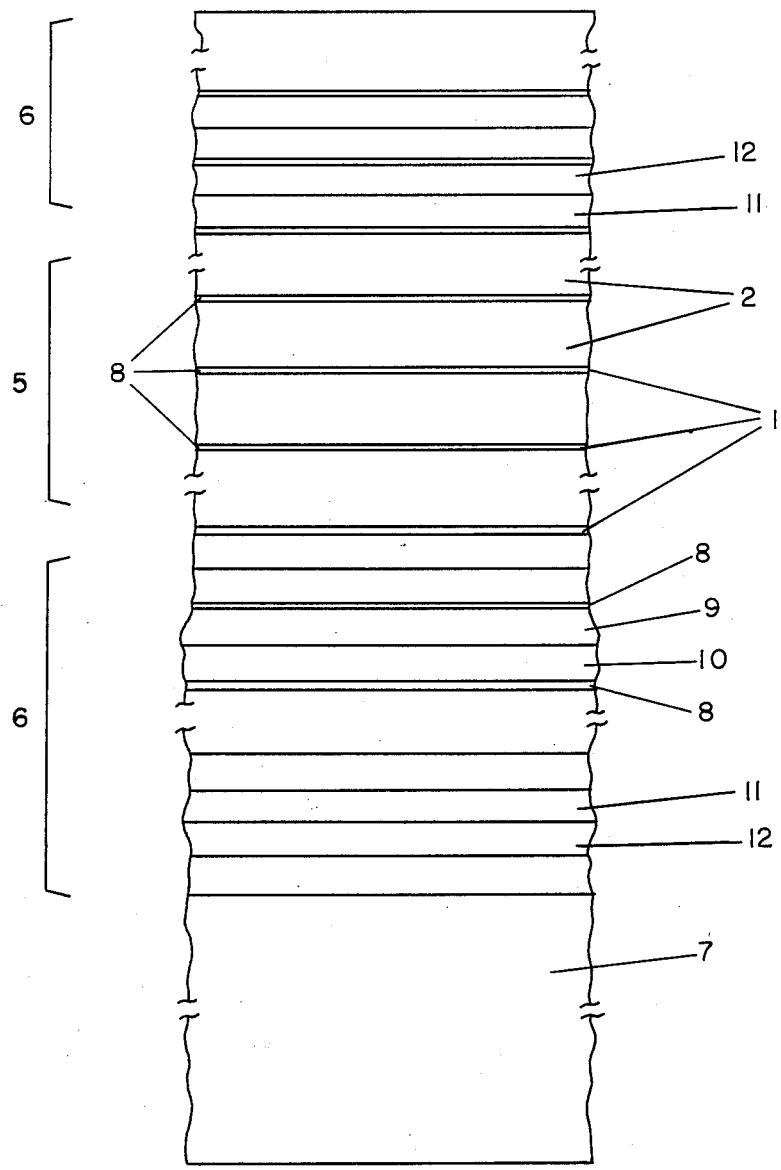
FIG—5

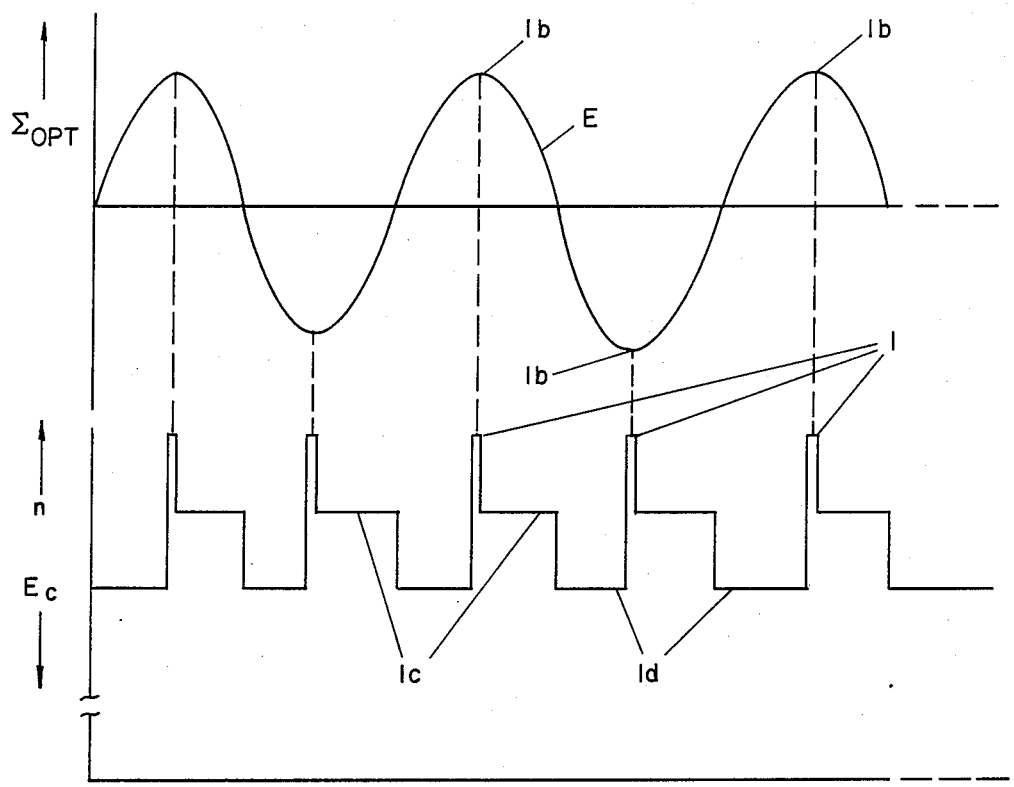
FIG — 6

WAVELENGTH-RESONANT SURFACE-EMITTING SEMICONDUCTOR LASER

This invention was made with Government support under Contract No. F-49620-87-C-0119 awarded by the U.S. Department of the Air Force, and the Government has certain rights in this invention.

BACKGROUND AND FIELD OF THE INVENTION

Conventional semiconductor lasers emit radiation parallel to the surface of the wafer. This geometry is inconvenient in numerous applications involving a variety of optoelectronic devices on the same wafer. Development of an efficient surface-emitting injection laser would considerably accelerate progress in areas such as monolithic optoelectronic integration and optical interconnections.

DISCUSSION OF RELATED ART

Currently existing surface emitters with vertical cavities suffer from low efficiency due to competition between the desired emission perpendicular to the wafer surface and the parasitic amplified spontaneous emission propagating in the active region parallel to the wafer surface. In particular, this problem exists with the arrangement disclosed by P. L. Gourley and T. J. Drummond, "Visible, room-temperature, surface-emitting laser using an epitaxial Fabry-Perot resonator with AlGaAs/AlAs quarterwave high reflectors and AlGaAs/GaAs multiple quantum wells", Appl Phys. Lett. 50, pp. 1225–1227, May 1987. These workers used integral high-reflectors in an optically pumped surface-emitting semiconductor laser. The gain region was a conventional multiple quantum well structure with 10-nm GaAs quantum wells and 20-nm AlGaAs spacers. The spacing between quantum wells was much smaller than the lasing wavelength in the medium.

Another arrangement having similar difficulty is disclosed by M. Ogura, W. Hsin, M. C. Wu, S. Wang, J. R. Whinnery, S. C. Wang, and J. J. Yang, "Surface-emitting laser diode with vertical GaAs/GaAlAs quarter-wavelength multilayers and lateral buried heterostructure", Appl. Phys. Lett. 51, pp. 1655–1657, Nov. 1987. The arrangement employs stacks of multiple quarter-wavelength layers as reflectors and a uniform gain medium with transverse electrical injection. There are no quantum wells and the gain region is isotropic.

SUMMARY OF THE INVENTION

The present invention provides an electromagnetic wave amplifying semiconductor arrangement for a surface-emitting semiconductor laser which optimizes the effective gain per unit length of the laser. This is accomplished by use of a multiquantum well structure gain medium comprising a stack of thin and thick semiconductor slabs (i.e., bodies or layers) alternately spaced from each other along an axis such that the combined width of each adjacent thick and thin body is approximately equal to an integral multiple of one-half the wavelength to be amplified. Each thin slab or quantum well is much thinner than the lasing wavelength and acts as a quantum well of small bandgap providing amplification. This dimensional relationship produces an amplified standing EM wave perpendicular to the axis. The antinodes or interference maxima of this EM wave coincide with the quantums.

BRIEF DESCRIPTION OF THE DRAWINGS

Referring to the drawings in which like reference numerals denote like parts:

FIG. 3 is an illustration of detail of a wavelength-resonant active layer structure incorporating a metallic reflector and a quarter-wavelength layer in accordance with an embodiment of the present invention;

FIG. 4 is a schematic diagram of a surface emitting laser structure in accordance with an embodiment of the present invention;

FIG. 5 is a schematic diagram of a hybrid structure with wavelength-resonant active layer, additional gain elements distributed through some of the inner reflecting layers, and additional reflecting layers in accordance with an embodiment of the present invention;

FIG. 6 is a schematic diagram explaining operation of a hybrid structure with wavelength-resonant active layer combined with multiple quarter-wavelength reflecting layers in accordance with an embodiment of the present invention.

DESCRIPTION OF THE PREFERRED EMBODIMENT

Figure 1:
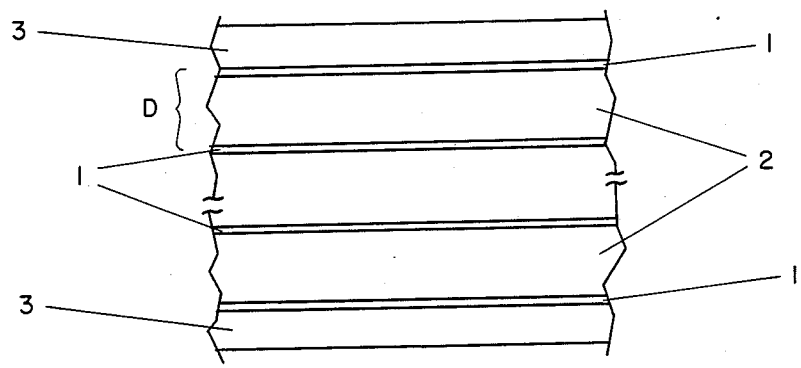
FIG. 1 is a schematic diagram of a detail of a wavelengthresonant active layer structure in accordance with an embodiment of the present invention.
Figure 2:
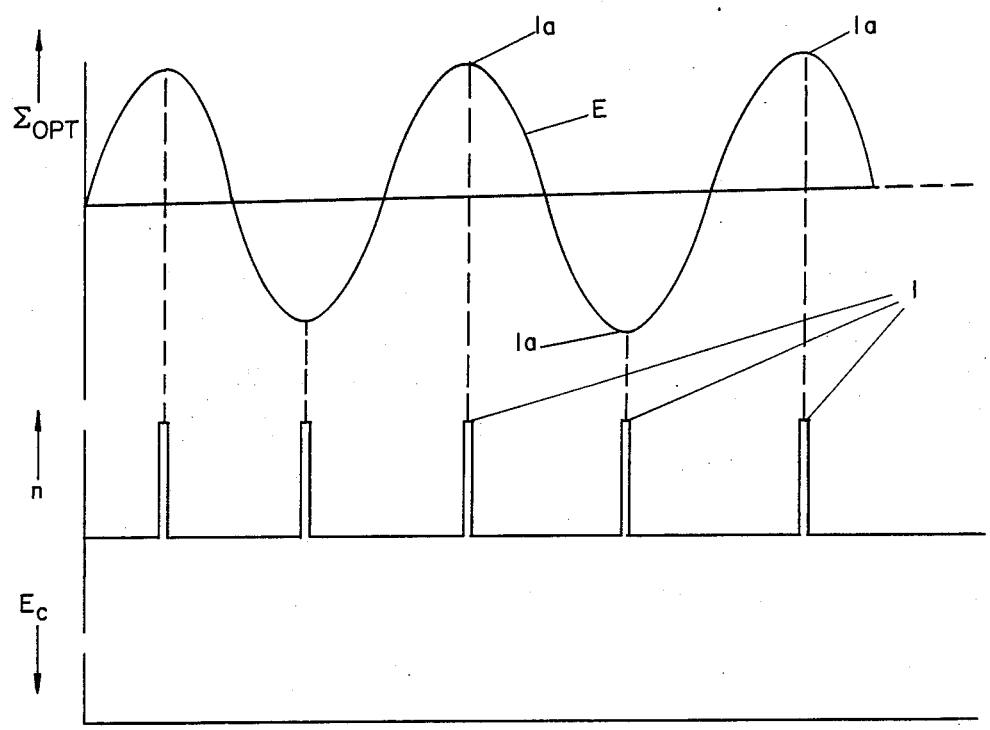
FIG. 2 is a schematic diagram explaining operation of a wavelength-resonant active layer structure in accordance with an embodiment of the present invention.

The surface emitting laser of this invention employs a multiple quantum well structure as shown in FIG. 1. The active gain regions or quantum wells 1 are separated by wider bandgap regions 2 so that the total width of one period, (a period being the combined width of the quantum well 1 plus one separation region 2) is an integral multiple of one-half of the wavelength of the laser in the medium. The end caps 3 are chosen to match the boundary conditions for the lasing wave in the reflectors. When single-layer metallic reflectors are used, they are approximately ¼ wavelength in thickness. The thicknesses of the quantum wells, nominally 5–20 nm, are much smaller than the lasing wavelength. For the GaAs-AlGaAs system the lasing wavelength may be in the vicinity of 820 nm corresponding to a wavelength in the medium of approximately 240 nm. The dimensions of the structure are chosen such that a standing electromagnetic wave along an axis perpendicular to the planes of the quantum wells and spacer regions is amplified as efficiently as possible. This occurs because, as shown in FIG. 2, the gain regions 1 are coincident with the antinodes (interference maxima) 1a of the standing wave E. However, for electromagnetic waves propagating parallel to the planes of the quantum wells, the gain is reduced because they overlap poorly with the very thin quantum well gain regions. In effect this results in an anisotropic gain medium which results in higher laser efficiency because parasitic losses due to amplified spontaneous emission are lower than in conventional surface emitting laser designs. Other significant features of the design are the narrow gain bandwidth due to the periodic gain medium and the suppression of spatial hole-burning effects due to confinement of the electrons in the quantum wells.

Referring to FIG. 3, the wavelength resonant active layer structure according to the invention is shown as a stack of alternately spaced quantum wells or thin localized gain regions 1 separated from each other by halfwave spacers 2 of lower refractive index than regions 1. At each end is a ¼ wavelength phase-matching end cap 3 and a resonator mirror or reflector 4 adjacent to an end cap.

The resonator mirrors such as 4 define the lasing mode (standing EM wave) in this structure. The higher the reflectivities of the mirrors, the lower the lasing threshold. For metallic high reflectors, the optical thickness of the final end cap layer on each side is optimally designed to be a ¼ wavelength. This structure is shown in FIG. 3. Alternative schemes for reducing the lasing threshold may employ multilayer high-reflectivity mirrors grown as an integral part of the semiconductor structure. Such a scheme is illustrated in FIG. 4 where the periodic gain medium (i.e., wavelength-resonant active layer structure depicted as the stack of elements 1 and 2 in FIG. 1) is indicated by the numeral 5. A highly reflecting multilayer stack 6 is located at each end.

The embodiment of the invention shown in FIGS. 5 and 6 is a hybrid surface-emitting laser structure which in accordance with the invention employs a wavelength-resonant multilayer periodic gain medium. In addition to the wavelength-resonant active region 5 having quantum well regions 1 and half-wave spacers 2 arranged as in FIG. 1, the structure has added localized gain regions or quantum wells 8 distributed among some of the multiple reflecting layers 6 (comprising alternating layers of materials having high and low indices of refraction), all on a common substrate 7. Each gain region 8 comprises alternate ¼ wavelength layers 9 and 10 stacked on each side of the region 5. At each end of the resonator there are provided additional ¼ wavelength reflecting layers 11 and 12. In effect the structure has a hybrid resonator using added quantum well gain layers distributed throughout the multilayer reflectors.

Referring to FIG. 6, with this arrangement the antinodes 1b of the standing electromagnetic wave coincide with the quantum wells 1 not only in the active region 5, as shown in FIG. 2, but also in the region of the multilayer reflectors 6. FIG. 6 also shows a portion of one of the multilayer reflectors 6 in which quantum wells 8 have been included, the numerals 1c and 1d being used respectively to denote quarter-wave layers of high-index and low-index materials. The primary advantage of this embodiment is that it permits the use of more quantum wells, and hence a longer gain medium, for a given overall cavity length.

Figure 7:
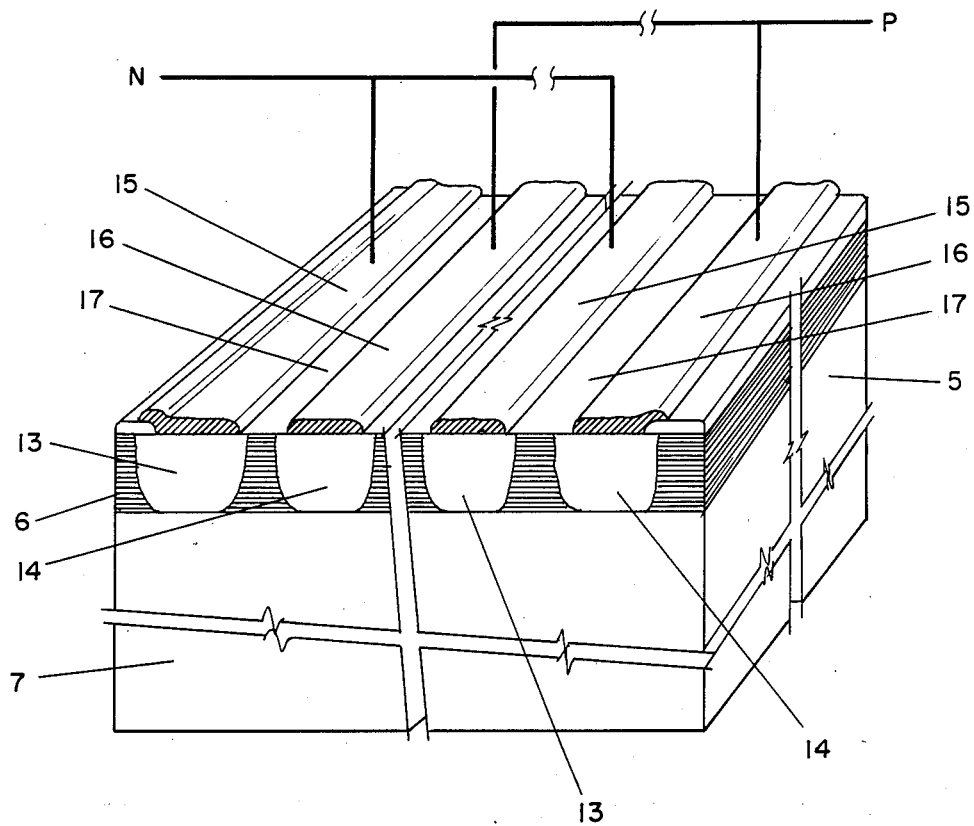
FIG. 7 is an illustration of a transverse junction scheme for current pumping of the wavelength-resonant surface-emitting laser in accordance with an embodiment of the present invention.

FIG. 7 illustrates a transverse junction scheme for pumping of a wavelength-resonant surface-emitting laser such as is shown in FIG. 4 or FIG. 5 by electrical current injection, in accordance with an embodiment of the present invention. The wavelength-resonant multilayer periodic gain medium 5, which may include highly reflecting layers 6 at either end, is deposited on a substrate 7 and then modified by introduction of diffused, implanted or otherwise-formed n-type regions 13 and p-type regions 14, to which negative contacts 15 and positive contacts 16 are respectively attached, these contacts being separated by insulating or semi-insulating regions 17. Multiple emitting stripes may be defined by forming multiple pairs of p- and n-contacts, which may be individually addressed or may be connected in parallel as shown.

Transverse mode control may be used to achieve highbrightness, high-efficiency semiconductor lasers. Several schemes are possible. External cavities are the most straightforward. Incorporation of monolithic nonplanar end reflectors as part of the fabrication process is also possible. For phase locking of arrays of such surface emitting lasers it may be desirable to include a grating (or bi-grating) structure normal to the lasing direction to couple small amounts of optical field between adjacent laser structures. This could be fabricated either before or after the growth of the quantum-well gain region.

OPERATION OF THE PREFERRED EMBODIMENT

Referring to FIGS. 1, 2, and 3, very thin quantum-well gain layers 1 are sandwiched between wider-bandgap (lower refractive index) spacers 2. The thickness D of each spacer 2 approximately equals one-half of the peak wavelength of quantum well emission in the spacer materials, i.e., $$D = \frac{\text{lambda}}{2 \text{ mu}}$$

where lambda is the free-space wavelength corresponding to the quantum well gain peak, and mu is the refractive index of the spacer material at this wavelength. The cap layers 3 at the ends of the active layer have optical thicknesses of one-quarter of the lasing wavelength. In this way the antinodes of the standing optical electric field amplified in the active layer are induced or forced to coincide with the quantum well gain layers 1 as shown in FIG. 2, thus optimizing the spatial overlap integral between the field and gain distribution along the normal direction. Hence, the effective gain of the structure along the axis perpendicular to the planes of the quantum wells (sometimes referred to as the designated cavity axis) is enhanced, with an additional built-in wavelength selective mechanism.

The wavelength resonant active layer 5 shown in FIG. 4 is pumped by optical absorption or carrier injection, and the gain thus generated leads to laser oscillation normal to the active region. Laser oscillation in the normal direction rather than in the plane is ensured by using highly efficient multilayer reflectors 6. The wavelength resonant active layer structure of the invention optimizes the total gain factor in the normal direction at the desired operating wavelength. The entire structure is grown on and thus rests on a rigid substrate 7, which enhances the overall mechanical strength of the structure.

This wavelength-resonant active layer structure of the invention has a narrow amplification bandwidth, thus providing discrimination against amplified spontaneous emission.

In accordance with the embodiment of the invention shown in FIG. 5, there is employed a conventional double heterostructure with a multiple quantum well active region using ½ wavelength spacing as described previously. The rest of the cavity is formed with multilayer reflectors on the top and bottom. This pushes the reflectivity to nearly 100% on the bottom reflector and somewhat less on the top MLR to allow surface emission to escape. Preferably, the respective reflectivities should be about 99.8% R on bottom and 97% R on top. The reflectors are designed to produce maximum reflectivity by placing the low index layer before the higher index as the beam leaves the active region. The reflectivity can be affected by altering the number of periods of the multilayer reflector. Another advantage of this structure is that the active region is made of the same materials and thicknesses as the surrounding reflectors and the cavity is more like a distributed feedback device as opposed the previous design where the cavity is a bragg reflector type.

A fabrication of an arrangement according to an embodiment of the invention shown in the embodiment of FIG. 7, may include the use of an undoped epitaxial structure and high quality diffusion (through a mask) of species such as Si and Zn. The Si and Zn may be patterned and diffused sequentially to cause Impurity Induced Disordering, to form the lateral cavity dimensions as well as injecting carriers electrically in the active region. Conventional techniques may then be used to form ohmic contacts and bonding pads. The design is naturally suited to interdigitation as shown to form large area, high power emitters. The lateral stripe to stripe coupling may be achieved by 2nd-order Bragg coupling in the plane of the layers, or by evanescent coupling if the geometry is small enough.

In accordance with the principles of the invention, various pumping mechanisms are feasible, including optical pumping, electron beam pumping, or electric current pumping, and transverse current injection as in the structure of FIG. 7.

In optical pumping the gain is provided by creating an above-threshold density of excited carrier pairs through absorption of an external light beam, usually one whose photon energy is greater than the energy bandgap of the active material in the laser.

Electric current pumping, and in particular, transverse current injection, may be more efficient and thus more useful for commercial applications. In such pumping, a density of minority carriers which is greater than a critical threshold value is injected across a transverse p-n or p-i-n- region to provide optical gain. Two prototype transverse injection structures can be used. A transverse p-n junction can be formed by diffusing a p-type dopant into an n-type structure, or vice versa. Carrier injection occurs preferentially into the quantum wells because of their lower energy bandgap. A similar phenomenon occurs in the embodiment illustrated in FIG. 7, in which the material is intrinsic but n-type and p-type regions are formed by n-and p-diffusions and impurity -induced disordering of the quantum wells. Another possible scheme for electrical pumping by transverse injection is to use alternately n- and p-doped spacer layers with undoped quantum wells in a nipi configuration.

What is claimed is:

1. An electromagnetic wave-amplifying semiconductor device comprising pumping means for providing energy; a gain medium for receiving said energy and composed of a plurality of thin semiconductor bodies each acting as a quantum well of small bandgap and each equally separated from the other by a space, and a plurality of thick semiconductor bodies, each thick body with a bandgap substantially larger than said small bandgap and occupying the space between adjacent ones of said first semiconductor bodies, both of said pluralities of bodies thereby constituting a stack of thick and thin semiconductor bodies alternately oriented along a line, the thickness of each of said thin semiconductor bodies in the direction of the line being substantially less than the wavelength of the electromagnetic wave in the medium and substantially less than the thickness of each of the thick semiconductor bodies and the combined thickness of a pair of adjacent thin and thick bodies being approximately equal to an integral multiple of one-half the wavelength of the electromagnetic wave in said medium to amplified.

2. A semiconductor laser medium comprising pumping means for providing energy, a resonating gain medium for receiving said energy whereby standing electromagnetic waves are generated therein and composed of a first plurality of thin semiconductor bodies each acting as a quantum well of small bandgap and each equally separated from the other by a space, and a second plurality of thick semiconductor bodies, each thick body with a bandgap substantially larger than said small bandgap and occupying the space between adjacent ones of said first semiconductor bodies, both of said pluralities of bodies thereby constituting a stack of thick and thin semiconductor bodies alternately oriented along a line, the thickness of each of said thin semiconductor bodies in the direction of the line being at most approximately one-tenth the thickness of each of the thick semiconductor bodies and the combined thickness of a pair of adjacent thin and thick bodies being approximately equal to an integral multiple of one-half the lasing wavelength of the medium, whereby each of the maxima of the standing waves of the elctromagnetic field of the medium are in approximate registration with each of the thin semiconductor bodies.

3. A semiconductor laser medium as in claim 2 wherein each of said thick semiconductor bodies compises first and second semiconductor portions each of optical thickness in the direction of said line equal to approximately one-fourth the wavelength of the lasing wavelength in said medium.

4. A semiconductor laser medium as in claim 2 further comprising a substrate common to said first and second pluralities of semiconductor bodies.

5. A semiconductor laser medium as in claim 2 further comprising a multilayer reflector comprising quarter wave layers at each end of the gain medium and a further plurality of semiconductor bodies establishing quantum wells interposed between at least one pair of said quarter wave layers.

6. A semiconductor laser medium as in claim 4 and comprising multiple pairs of further pluralities of semiconductor bodies respectively identical to said first and second pluralities, said first and second, and multiple pairs of pluralities comprising a multiplicity of arrays located on said substrate and optically coupled to enable exchange of phase information therebetween.

7. A semiconductor laser medium as in claim 6 further comprising means coupled to said pump means to selectively address said arrays.

8. A semiconductor laser medium as in claim 2 wherein said stack has two ends and further comprises reflecting means at each end.

* * * * *